(12) United States Patent
Korthout et al.

(10) Patent No.: US 10,931,890 B2
(45) Date of Patent: Feb. 23, 2021

(54) IMAGE SENSOR SYSTEM

(71) Applicant: Teledyne DALSA B.V., Eindhoven (NL)

(72) Inventors: Laurens Korthout, Torenstraat (NL); Vincent Arkesteijn, Mooienhof (NL)

(73) Assignee: TELEDYNE DALSA B.V., Eindhoven (NL)

( * ) Notice: Subject to any disclaimer, the term of this patent is extended or adjusted under 35 U.S.C. 154(b) by 0 days.

(21) Appl. No.: 16/421,250

(22) Filed: May 23, 2019

(65) Prior Publication Data
US 2020/0021753 A1    Jan. 16, 2020

(30) Foreign Application Priority Data

Jul. 13, 2018   (EP) ..................................... 18183362

(51) Int. Cl.
| | |
|---|---|
| *H04N 5/32* | (2006.01) |
| *H01L 27/142* | (2014.01) |
| *H04N 5/341* | (2011.01) |
| *H04N 5/3745* | (2011.01) |

(52) U.S. Cl.
CPC ............ *H04N 5/32* (2013.01); *H01L 27/142* (2013.01); *H04N 5/341* (2013.01); *H04N 5/37455* (2013.01)

(58) Field of Classification Search
CPC ...... H04N 5/32; H04N 5/341; H04N 5/37455; H04N 5/378; H04N 5/3577; H01L 27/142
See application file for complete search history.

(56) References Cited

U.S. PATENT DOCUMENTS

| | | | |
|---|---|---|---|
| 2008/0135729 A1* | 6/2008 | Taura ................... | H04N 5/3765 250/208.1 |
| 2014/0266991 A1* | 9/2014 | Chou ..................... | H04N 5/361 345/55 |

FOREIGN PATENT DOCUMENTS

WO    WO2017/076748 A1    5/2017

OTHER PUBLICATIONS

Extended European Search Report, dated Oct. 4, 2018, European Patent Application No. EP 18183362.5.

* cited by examiner

*Primary Examiner* — David P Porta
*Assistant Examiner* — Meenakshi S Sahu
(74) *Attorney, Agent, or Firm* — M.J. Ram and Associates

(57) ABSTRACT

The present invention relates to an image sensor system. The invention further relates to an X-ray imaging system comprising such an image sensor system. More in particular, the present invention is related to image sensor systems that use a relatively small pixel width.

The present invention proposes to group the pixel columns in a plurality of column groups, each column group comprising at least three columns of pixels. The binary counters corresponding to the columns in a column group are reset at the start of a conversion cycle such that at least three columns among the at least three columns in a column group are reset to a different initial value.

15 Claims, 5 Drawing Sheets

IMAGE SENSOR SYSTEM

This application claims priority to European Application No. 18183362.5, filed Jul. 13, 2018. The application referred to in this paragraph is incorporated by reference as if set forth fully herein.

The present invention relates to an image sensor system. The invention further relates to an X-ray imaging system comprising such an image sensor system.

Image sensor systems are known in the art. An example of a system in accordance with the preamble of claim 1 is shown in FIG. 1. In this figure, a matrix (only a small segment A of the matrix is shown) of photo-sensitive pixels 1 is shown in which the pixels are arranged in rows and columns. This matrix comprises a plurality of column busses 2. The pixels that are arranged in the same column are connected to the same column bus 2.

Different pixel architectures are known from the art. Signal integrating pixels are at least equipped with a photo sensitive element and a charge storage capability to collect liberated charges. Depending on the selected pixel architecture various transistors are included in the pixel design to control the pixel operation and support the pixel signal read-out process.

The output signal of the pixel is generally put onto column bus 2 when a pixel 1 is selected for read out. Each row of pixels 1 may be controlled by a row controller 3, which typically controls the pixel integration and read-out process. Generally, only a single row of pixels 1 is selected for read out at a time to prevent the situation that two pixels 1 in the same column put an output signal onto column bus 2.

Several different read out strategies are known by which an appropriate signal can be read out that is representative for the amount of light energy projected on a pixel during the integration period. Within the context of the present invention this appropriate signal is referred to as the pixel signal. For example, correlated double sampling schemes are known to reduce the impact of pixel reset noise.

The pixel signal, either a current, a charge, or a voltage, can be based on one or more different output signals for the same pixel. For a typical pixel read-out, a pixel reference level (V1) and a signal level (V2) are measured from the pixel. The pixel signal is determined by subtracting these signal levels from each other in either the analog or digital domain. Within the context of the present invention, the pixel signal may either relate to the combination of different output signals as described above or to the individual output signals.

The image sensor system is configured to output a series of digital numbers, wherein each digital number is representative for the amount of light energy detected by a particular pixel 1. To this end, the image sensor system comprises a conversion unit that converts the pixel signals into respective digital numbers.

Referring to the example above, when the pixel voltage relates to V1 or V2, the conversion unit may be configured to convert V1 and V2 to a respective digital number. The subtraction of the converted signal levels can then be performed in the digital domain.

In a known approach to convert the analog pixel signals into digital numbers, shown in FIG. 1, the conversion unit comprises a global ramp unit 4, a comparator 5, and a binary counter 6. The global ramp unit 4 generates a ramp voltage and provides this voltage to comparator 5. When the momentary pixel voltage is higher than the ramp voltage, comparator 5 outputs a count enable signal to binary counter 6. This counter will increase its count value provided that a falling or rising edge is detected on its clock input. However, when the pixel voltage is lower than the momentary ramp voltage the counting process stops. More in particular, comparator 5 will output a count disable signal to binary counter 6. Regardless of whether a falling or rising edge is detected at the clock input of binary counter 6 its count value will not change.

As can be seen in FIG. 1, a comparator 5 and binary counter 6 are separately arranged for each pixel column. However, only a single global ramp unit 4 is used for distributing the ramp voltage to each comparator 5.

After conversion has completed, that is after each comparator has switched its output to the count disable signal and/or after the ramp voltage has reached its end voltage, the binary count values for the various pixel columns are collected by a binary count value collecting unit 9, which may also be controlled by controller 7. Such unit may be configured to output, for example in a sequential manner, the binary count values of a given row of pixels as soon as these values become available. Alternatively, the binary count value collecting unit may comprise a memory in which the values are stored to allow the output of a single data stream that comprises data for each row of pixels.

In advance of each conversion cycle, controller 7 resets binary counters 6 in each pixel column to an initial value, e.g. a zero value to allow a next conversion of pixel signals to start. These latter signals may correspond to the same row of pixels, for example because these pixels have been re-selected. However, these signals normally correspond to a different row of pixels, for example an adjacent row. To this end, controller 7 may optionally control row controller 3 to select a different row or to re-select the same row for read out, and/or to initiate a next integration period for capturing light. The controlling performed by controller 7 may be clocked using one or more clock signals. This or these clock signal(s) as well as the clock signal provided to binary counters 6, and other components if required, is/are generated by a clock signal unit 8 that distributes one or more clock signals to the various components in the system.

Controller 7 is generally also responsible for initiating a conversion cycle by controlling if global ramp unit 4 should start with outputting a next ramp voltage.

The image sensor system can be realized in CMOS technology. For example, a sensor may comprise a tile, wherein the tile corresponds to an integral part of a Si wafer. Alternatively, the sensor may comprise a plurality of tiles that are butted. Within the context of the invention, the conversion unit may be arranged on each tile or the conversion unit may be located only on the bottom or top tile. Alternatively, the conversion unit, or at least parts thereof, can be realized on separate integrated circuit dies, separate from the pixel matrix, and may optionally be realized in different semiconductor technologies.

A known problem encountered with the image sensor system in FIG. 1 is related to the fluctuation of the current that is drawn from the supply by the binary counters during the counting process. For example, the count values for all the binary counters in the known system for which the corresponding pixel voltage is larger than the ramp voltage, i.e. the binary counter is counting, are identical. When binary counters are used that output a binary number, a problem may arise when the count value changes between binary numbers such as 0111 and 1000. In these cases, a large number of bits will simultaneously toggle as each counting binary counter experiences the same change. Consequently, at these count values transitions, large peak currents will flow through the supply lines. If the supply current variations become too large, the behavior of other components in the system may be influenced via supply crosstalk. For example, the ground GND and supply VDD domains are shared between multiple circuits on the same chip. The limited Power Supply Rejection Ratio of circuits will sense voltage drop variations on these shared supply lines introducing interferences to their outputs. These interferences can result in image quality degradation.

In the paper "CMOS Flat-Panel X-ray Detector With Dual-Gain Active Pixel Sensors and Column-Parallel Readout Circuits", by Yun-Rae Jo et al, published in the IEEE transactions on nuclear science, Vol. 61, No. 5, October 2014, pages 2472-2479, an approach is disclosed to reduce power fluctuation caused by the toggling of bits. In this paper, gray-code counters are used instead of the less complex binary ripple counters. Gray-code counters are characterized in that the number of toggling bits for each counting step is identical, i.e. one bit. Hence, when using gray-code counters for converting pixel voltages into digital numbers, the problem of a large variation over time in the number of toggling bits per counting step during the counting process does not exist.

In the abovementioned paper, it is stated that bit transitions in every bit of all column counters generate a large peak current from the supply voltage to the ground level, which causes a power fluctuation. To alleviate the power fluctuation, the authors of the paper propose to use even and odd counters in column-parallel readout arrays that have different initial values of "0" or "1". It is further stated that because the adjacent two column counters have different initial values, bit transitions in opposite direction are cancelled out, which reduces peak current and power fluctuation. For example, an odd column may experience a change from 0 to 1 whereas the even column may experience, at substantially the same time and due to the different initial value, a change from 1 to 0. According to the paper, the effect of a 0 to 1 transition on the current drawn from the supply can be cancelled by a simultaneous 0 to 1 transition.

The abovementioned concept of cancellation is described in more detail in the following table. In this table, a list is presented of decimal numbers and a corresponding gray code. Furthermore, the number of transitions from 0 to 1 (#0>1) and the number of transitions from 1 to 0 (#1>0) is shown between adjacent gray codes.

| Decimal number | Gray code | # 0 > 1 | # 1 > 0 |
| --- | --- | --- | --- |
| 0 | 00000 | NA | NA |
| 1 | 00001 | 1 | 0 |
| 2 | 00011 | 1 | 0 |
| 3 | 00010 | 0 | 1 |
| 4 | 00110 | 1 | 0 |
| 5 | 00111 | 1 | 0 |
| 6 | 00101 | 0 | 1 |
| 7 | 00100 | 0 | 1 |
| 8 | 01100 | 1 | 0 |
| 9 | 01101 | 1 | 0 |
| 10 | 01111 | 1 | 0 |
| 11 | 01110 | 0 | 1 |
| 12 | 01010 | 0 | 1 |
| 13 | 01011 | 1 | 0 |
| 14 | 01001 | 0 | 1 |
| 15 | 01000 | 0 | 1 |
| 16 | 11000 | 1 | 0 |

From the table above it can be concluded that by selecting a pair of pixel columns, i.e. and odd and even column, and by using a different initial value for them, some form of cancellation can be achieved. Still, at each counting step, the number of toggling bits is equal to the number of gray-code counters that are still counting at that moment.

Unfortunately, gray-code counters are relatively complex and require a substantially larger footprint than binary ripple counters. Consequently, gray-code counters are not the preferred solution in sensors that require a small pixel pitch.

Unfortunately, the abovementioned approach of cancelling bit transitions cannot be applied in binary ripple counters. This will be elucidated by referring to the table below which lists the number bit transitions, the number of 0 to 1 transitions and the number of 1 to 0 transitions for a binary ripple counter.

| Decimal number | Binary number | # bit transitions | # 0 > 1 | # 1 > 0 |
| --- | --- | --- | --- | --- |
| 0 | 00000 | NA | NA | NA |
| 1 | 00001 | 1 | 1 | 0 |
| 2 | 00010 | 2 | 1 | 1 |
| 3 | 00011 | 1 | 1 | 0 |
| 4 | 00100 | 3 | 1 | 2 |
| 5 | 00101 | 1 | 1 | 0 |
| 6 | 00110 | 2 | 1 | 1 |
| 7 | 00111 | 1 | 1 | 0 |
| 8 | 01000 | 4 | 1 | 3 |
| 9 | 01001 | 1 | 1 | 0 |
| 10 | 01010 | 2 | 1 | 1 |
| 11 | 01011 | 1 | 1 | 0 |
| 12 | 01100 | 3 | 1 | 2 |
| 13 | 01101 | 1 | 1 | 0 |
| 14 | 01110 | 2 | 1 | 1 |
| 15 | 01111 | 1 | 0 | 1 |
| 16 | 10000 | 5 | 1 | 4 |

Firstly, the average number of bit transitions in a binary ripple counter for a counting step is roughly equal to two. Moreover, there exists a large variation in the number of bits that toggle for the various possible count values. This will cause a large variation over time in the number of bits that toggle, and will therefore result in a large variation over time in current drawn from the supply.

Secondly, unlike with a gray-code counter it is impossible to find suitable offsets between the different pixel columns such that the bit transitions of one column are cancelled by the bit transitions of another column.

For the reasons outlined above, the bit transition cancellation technique identified in the abovementioned paper cannot be applied in image sensor systems that require a small counter footprint.

Another known problem encountered with the image sensor system in FIG. 1 is related to the fluctuation of the current that is drawn from the supply by the binary counters when these binary counters change from operating in a counting mode to operating in a non-counting mode. In the counting mode, the binary counter increases its binary count value in dependence of the clock signal, whereas in the non-counting mode, the binary counter has stopped counting. The switch between these modes depends on the outcome of the comparison process of comparing the pixel signal to the momentary ramp signal.

When a binary counter stops counting, a drop in current drawn from the supply can be observed. Similar to the variation in current drawn from the supply caused by a variation in the number of toggling bits, this drop in current may result in unwanted interferences in the system as described above.

The abovementioned problem is addressed in EP 2 757 776 that discloses an approach wherein a set of N counters is used which set is divided into a first sub-set of counters and a second sub-set of counters. A control stage is arranged to enable the first sub-set of counters or the second sub-set of counters. This has an advantage that one of the sub-sets of counters is enabled at any time. During the entire conversion cycle one of the sub-sets of counters is counting and consuming current, while the other sub-sets of counters is idle. The power consumption does not depend on the analog signal level which is being converted.

A drawback of the approach described above is that multiple counters must be arranged in a column and different clock signals must be generated and routed adding to the complexity and costs of the system.

An object of the present invention is providing an image sensor system having a small counter footprint, in which the abovementioned problems associated with the variation in current drawn from the supply during counting do not occur or at least to a lesser extent.

The invention according to a first aspect provides an image sensor system that is characterized in that the columns of pixels are grouped in a plurality of pixel column groups, wherein each pixel column group comprises at least three columns of pixels. Furthermore, the controller is configured to reset the binary counters corresponding to the pixel columns in a pixel column group at the start of a conversion cycle such that at least three pixel columns among the at least three pixel columns in a pixel column group are reset to a different initial value. Here, the controller may be configured to simultaneously reset multiple or all binary counters.

By using at least three pixel columns in a pixel column group and using a different initial value for at least three of them, a variation over time in the number of bits toggling per counting step in a pixel column group is reduced compared to a variation over time in the number of bits toggling per counting step for a single pixel column. Consequently, the variation over time in the current drawn from the supply during the counting process can be reduced.

The initial values to be used by each binary counter are preferably predefined in hardware at the level of each binary counter. In this case, the controller is configured to trigger the binary counters to reset to the predefined initial value. Alternatively, the initial values are stored in memory and are communicated to each binary counter by or under the supervision of the controller.

In an embodiment, the binary count value collecting unit may comprise a compensating unit that is configured for subtracting the initial value corresponding to a given binary counter from the binary count value outputted by that binary counter.

The different initial values used in a pixel column group may correspond to a group of sequential binary numbers. The $m^{th}$ pixel column in a pixel column group may be given as initial value the $m^{th}$ lowest digital number to be outputted by the binary counter. For example, when the ordering of the pixel column is from left to right, the first pixel column on the left will have the binary equivalent of the decimal number 0 as initial value, whereas the $8^{th}$ column will have the binary equivalent of the decimal number 7 as initial value.

The variation in current drawn from the supply during a conversion process depends on the number of pixel columns in a pixel column group. However, the number of pixel columns cannot be made excessively high as this would limit the dynamic range in digital count values that are available for representing the amount of light that was captured by a pixel. Preferably, the binary counter is an n-bit binary counter, such as an 11 bit or 12 bit counter, wherein the initial values are values chosen from a group consisting of the $\alpha$ times $2^n$ lowest binary numbers that can be outputted by the binary counter, wherein $\alpha$ is a constant preferably smaller than 0.05. Preferably, at least two, and more preferably each, of the pixel column groups are identical.

The binary count value collecting unit may be configured for sequentially obtaining the binary count values from the pixel columns, and, for each read out binary count value corresponding to a given pixel column, to subtract the initial value associated with that given pixel column from the read out binary count value.

Typically, the binary count value collecting unit will read out the binary count values in a particular order. This order may correspond to a left-to-right direction or vice versa. Alternatively, particular columns, corresponding to a region of interest, can be read out first. Preferably, the binary count value collecting unit will read out the binary count values on a pixel column group basis. Furthermore, the binary count value collecting unit will read out the binary count values for each pixel column in the same order as the magnitude of the initial values for that pixel column group. For example, if the matrix of pixels comprises 128 columns, divided over 8 pixel columns groups each comprising 16 pixel columns, the initial values may range from 0 to 1111 (binary equivalent of 15). If the left column in a pixel column group is given the lowest initial value, i.e. 0, and the pixel column on the right the highest value, i.e. 1111, with the pixel columns in between being arranged in an order from low to high, it is preferred that the binary count value collecting unit reads out the left column first and ends with the column on the right.

If the binary count values corresponding to the different pixel columns are read out in the manner described above, a further binary counter may be used within the binary count value collecting unit to correct for the different initial values that have been used. For example, the binary count value collecting unit may be configured to obtain a next binary count value in dependence of a clock signal. In this case, the further binary counter may be configured to increase a count value outputted by the further binary counter in dependence of the clock signal. The binary count value collecting unit may further comprise a subtraction unit to subtract the count value from the binary count value that is obtained next. This allows for a convenient compensation of the different initial values. It should be noted that the clock signal to be used by or in the binary count value collecting unit may be generated by the aforementioned clock signal unit.

The controller may be further configured to, at the start of a conversion cycle, trigger the global ramp unit to start generating a ramp signal, such as a ramp voltage, wherein the ramp signal is preferably a single slope ramp signal.

Although the present invention is not limited to a particular binary counter, a binary ripple counter is preferably used, both for the column specific binary counters and optionally for the further binary counter in the binary count value collecting unit.

The image sensor system may further comprise a row selecting unit for selecting a single row of pixels among the rows of pixels. The row selecting unit may be controlled by the controller or may operate substantially independently based on one or more clock signals received from the clock signal unit.

According to a second aspect, the present invention provides an X-ray imaging system that comprises the image sensor system described above, wherein the matrix of pixels is covered by a scintillator layer for converting an incoming X-ray photon into visible light photon(s).

According to a third aspect, the present invention provides an image sensor system that comprises a matrix having rows and columns of photo-sensitive pixels, wherein pixels that are arranged in the same column are configured to output an output signal onto a column bus for that column if such pixel is selected for read out. The system further comprises a conversion unit for converting a pixel signal that is based on one or more output signals for a given pixel into a respective digital number, wherein the conversion unit comprises a global ramp unit configured for generating a ramp signal. The conversion unit further comprises, for each column of pixels, a comparator for comparing the relevant pixel signal to the ramp signal, and a binary counter configured to increase a binary count value in dependence of a clock signal and a result of said comparing.

The image sensor system further comprises a controller for resetting each binary counter to an initial value at the start of a conversion cycle, and a binary count value collecting unit for collecting the binary count values from each binary counter.

According to the third aspect, the image sensor system is characterized in that the conversion unit further comprises, for each column of pixels, a load that comprises a toggling unit configured for toggling a predefined number of bits in response to the clock signal. The load and binary counter are operable in a counting mode, in which mode the binary counter increases said binary count value in dependence of the clock signal and the load does not toggle, and in a non-counting mode, in which mode the binary counter has stopped counting and the load toggles said predefined number of bits in dependence of the clock signal. The predefined number corresponds to the average number of bits that toggle in the binary counter per counting step while the binary counter is in the counting mode. Here, the average number of bits that toggle in the binary counter per counting step can be computed by computing, for each possible counting step, the combined number of toggling bits in one, a plurality of the, or all binary counter(s), and to then average this combined number over the different counting steps. Typically, when the binary counters do not use different initial values as discussed above, the average determined for one or all of the binary counters will be identical.

The toggling unit may comprise a number of parallel arranged flip-flops, each flip-flop being configured to toggle a single bit. Each flip-flop may be configured to toggle, independently from the other, in dependence of the clock signal. The binary counter may comprise a plurality of cascaded flip-flops, wherein the type of flip-flop used in the binary counter is identical to the type of flip-flop used in the load, the binary counter preferably being a binary ripple counter.

Each flip-flop in the load may be connected, at its output, to a capacitance, said capacitance corresponding to the capacitive load seen by the toggling flip-flops in the binary counter. By connecting to the capacitance, the current drawn from the supply by the load more closely resembles the current drawn from the supply by a toggling flip-flop in the binary counter.

The comparator can be configured to output a count disable signal when the pixel signal is smaller than the momentary ramp signal and to output a count enable signal when the pixel signal is larger than the momentary ramp signal. Furthermore, the binary counter may comprise an enable input, a clock input, and an output, wherein the binary counter is configured to increase its binary count value in dependence of the clock signal received at the clock input and the count enable signal being received at the enable input. The load may be configured to toggle the predefined number of bits in dependence of the clock signal and whether the load receives the count disable signal.

According to the third aspect, the columns of pixels may be grouped in a plurality of pixel column groups, each pixel column group comprising at least three columns of pixels, wherein the controller is configured to reset the binary counters corresponding to the pixel columns in a pixel column group at the start of a conversion cycle such that at least three pixel columns among the at least three pixel columns in a pixel column group are reset to a different initial value. At least two, and preferably each, of the column groups may be identical.

The number of predefined bits may correspond to the average number of toggling bits per counting step per binary counter in the pixel column group. Here, it is noted that the average number of toggling bits per counting step computed per binary counter in the pixel column group may deviate from the average computed per single binary counter. This is due to the different initial values that are used in the pixel column group. For example, a first binary counter may toggle 3 bits for a given counting step whereas a second binary counter in the same pixel column group may toggle 1 bit due to the different initial value. Consequently, the average number of toggling bits for that counting step may be reduced compared to cases wherein all binary counters have identical initial values.

Furthermore, the initial values and the number of pixel columns in a pixel column group may be such that a variation over time in the number of bits toggling per counting step in a pixel column group is reduced compared to a variation over time in the number of bits toggling per counting step for a single pixel column.

The initial values to be used by each binary counter can be predefined in hardware at the level of each binary counter, in which case the controller can be configured to trigger the binary counters to reset to the predefined initial value.

The binary count value collecting unit may comprise a compensating unit that is configured for subtracting the initial value corresponding to a given binary counter from the binary count value outputted by that binary counter.

The different initial values may correspond to a group of sequentially arranged binary numbers. Additionally or alternatively, the controller can be configured to set, as initial value for an $m^{th}$ pixel column in a pixel column group, the $m^{th}$ lowest digital number to be outputted by the binary counter associated with that pixel column. Additionally or alternatively, the controller can be configured to simultaneously reset multiple or all binary counters. Additionally or alternatively, the binary counter is an n-bit binary counter, wherein the initial values are values chosen from a group consisting of the $\alpha$ times $2^n$ lowest binary numbers that can be outputted by the binary counter, wherein a is a constant preferably smaller than 0.05.

The binary count value collecting unit can be configured for sequentially obtaining the binary count values from the pixel columns, and, for each read out binary count value corresponding to a given pixel column, to subtract the initial value associated with that given pixel column from the read out binary count value. The binary count value collecting unit is preferably configured to obtain a next binary count value in dependence of a clock signal, wherein the binary count value collecting unit further comprises a further binary counter that is configured to increase a count value outputted by the further binary counter in dependence of said clock signal, and a subtraction unit to subtract the count value from the binary count value that is obtained next.

The controller can be further configured to, at the start of a conversion cycle, trigger the global ramp unit to start generating the ramp signal, the ramp signal preferably being a single slope ramp signal. Additionally or alternatively, the image sensor system further comprises a row selecting unit for selecting a single row of pixels among the rows of pixels.

According to a fourth aspect, the present invention provides an X-ray imaging system that comprises the image sensor system described above in conjunction with the third aspect of the invention, wherein the matrix of pixels is covered by a scintillator layer for converting an incoming X-ray photon into visible light photon(s).

Next, the present invention will be described in more detail by referring to the appended drawings, wherein.

Figure 1:
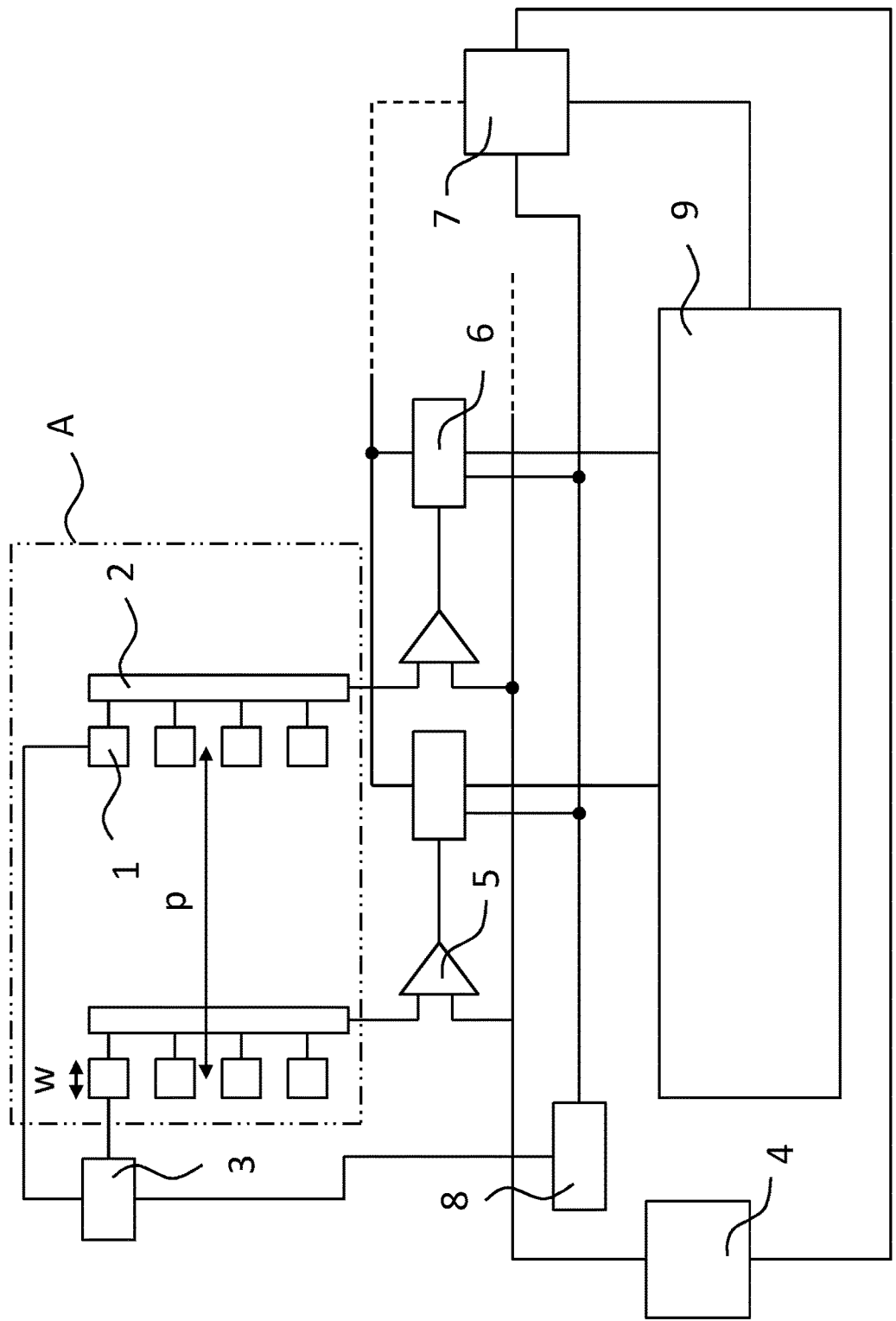
FIG. 1 illustrates a known image sensor system.
Figure 2:
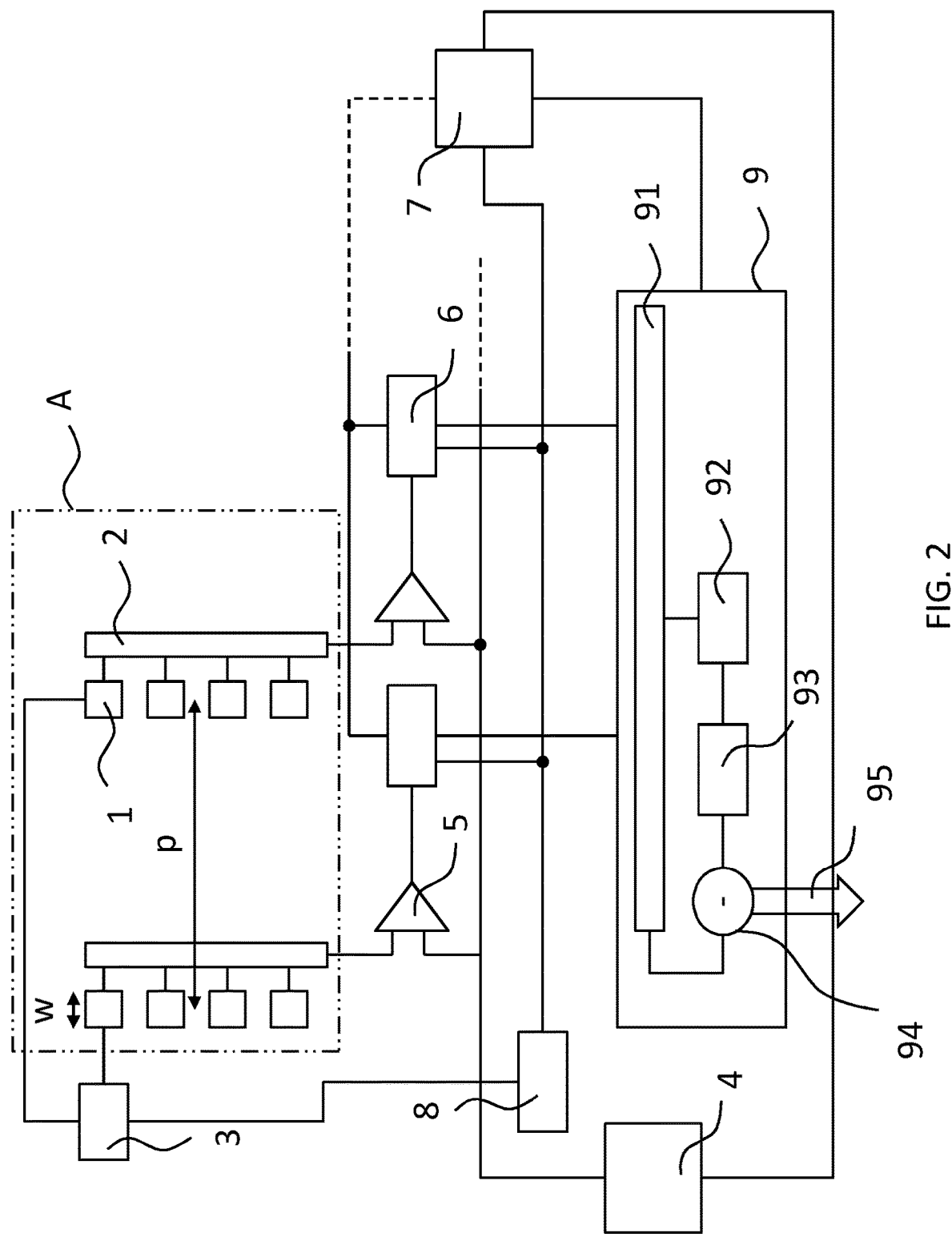
FIG. 2 illustrates an embodiment of the invention showing the binary count value collecting unit.

FIG. 2 illustrates an embodiment of the invention in which binary count value collecting unit 9 comprises a collector 91 for collecting the binary count values from binary counters 6, a further binary counter 93, a subtracting unit 94, and a controller 92. Here, further binary counter 93 is configured to count from 0 (binary) to 1111 (binary). The operation of an embodiment of the image sensor system according to the invention will be described next using an example of a 1024×1024 sensor.

The 1024 pixel columns are grouped in 64 pixel column groups, each group comprising 16 pixel columns. In each pixel column group, the pixel columns are numbered left to right, starting with 0 and ending with 15. Each pixel column is associated with an initial value to be used by binary counter 6 in that group that equals the binary equivalent of the pixel column number. Accordingly, the 25$^{th}$ pixel column corresponds to the second pixel column group, and in that pixel column group, it will be given pixel column number 9 and will consequently be associated with initial value 1000.

Hereinafter, the pixel signal corresponds to a pixel voltage. However, the invention is not limited to voltages and other electrical signals, such as currents or electrical charges, or combinations thereof may be used.

When the pixel voltage becomes available on column busses 2, a conversion cycle can be started. Controller 7 will reset binary counters 6 to the corresponding initial values as described above and will instruct or trigger global ramp unit 4 to generate a ramp voltage that is distributed to comparator 5 in each pixel column. This trigger or instruction will preferably by synchronized to or with the clock signal generated by clock signal unit 8. Each time a rising edge is detected in the clock signal received at a binary counter 6, which counter will increase its count value provided that the momentary value of the ramp voltage is smaller than the pixel voltage to be converted by that binary counter. More in particular, comparator 5 will output a count enable signal, e.g. a high logical value, to binary counter 6 if the momentary ramp voltage is smaller than or equal to the pixel voltage, and will output a count disable signal, e.g. a low logical value, if the momentary ramp voltage is larger than the pixel voltage.

Typically, the ramp voltage and the binary counters are matched and synchronized in the sense that by the time the binary counter has received a number of rising edges that corresponds to the maximum number to be outputted by that counter, the ramp voltage has reached its end voltage. It should be noted that the present invention is not limited to linear ramp signals. Curved ramp signals may equally be used to attribute more weight to either low or high pixel signals.

After the end voltage has been reached and/or if all comparators output the count disable signal, the count values of binary counters 6 are collected by collector 91, and a next row of pixels can be read out. The invention does not exclude the use of buffering techniques to temporary store the binary count values in memory to allow a next conversion cycle to start even though the previous binary count values have not been outputted by binary count value collecting unit 9. For example, each binary counter may be equipped with a memory to store the final binary count value while still being able to perform a counting operation in connection with a next conversion cycle. Alternatively, such buffering may be implemented in binary count value collecting unit 9.

Once the pixel voltages for a full row of pixels have been read and/or buffered, further controller 92 instructs further binary counter 93 to start counting from 0 to 1111 (binary). At the same time, it will instruct collector 91 to output the count value for a particular pixel column. Preferably, the process will start by reading out the outer left pixel column. Typically this process is synchronized using a clock signal that may optionally be generated by clock signal unit 8. Alternatively, this signal is generated by a dedicated clock signal inside binary count value collecting unit 9.

The output of further binary counter 93 and the count value obtained from collector 91 are fed to subtracting unit 94. Here, the count value of further binary counter 93 is subtracted from the obtained count value. Each time a new count value is obtained from collector 91, the count value of further binary counter 93 is increased. In this manner, the initial value that was used for a given pixel column can be compensated.

After further binary counter 93 has reached its final count value, it is reset by controller 92 so that the count values for a next pixel column group can be processed.

Subtracting unit 94 may be configured to output a stream of corrected count values as indicated by arrow 95. Alternatively, prior to outputting the corrected count values for a row of pixels, the corrected count values are stored in a memory in binary count value correcting unit 9. Alternatively, the count values for all the pixels of the matrix may be stored in a memory in binary count value correcting unit 9 prior to outputting these values as a stream.

Figure 3A:
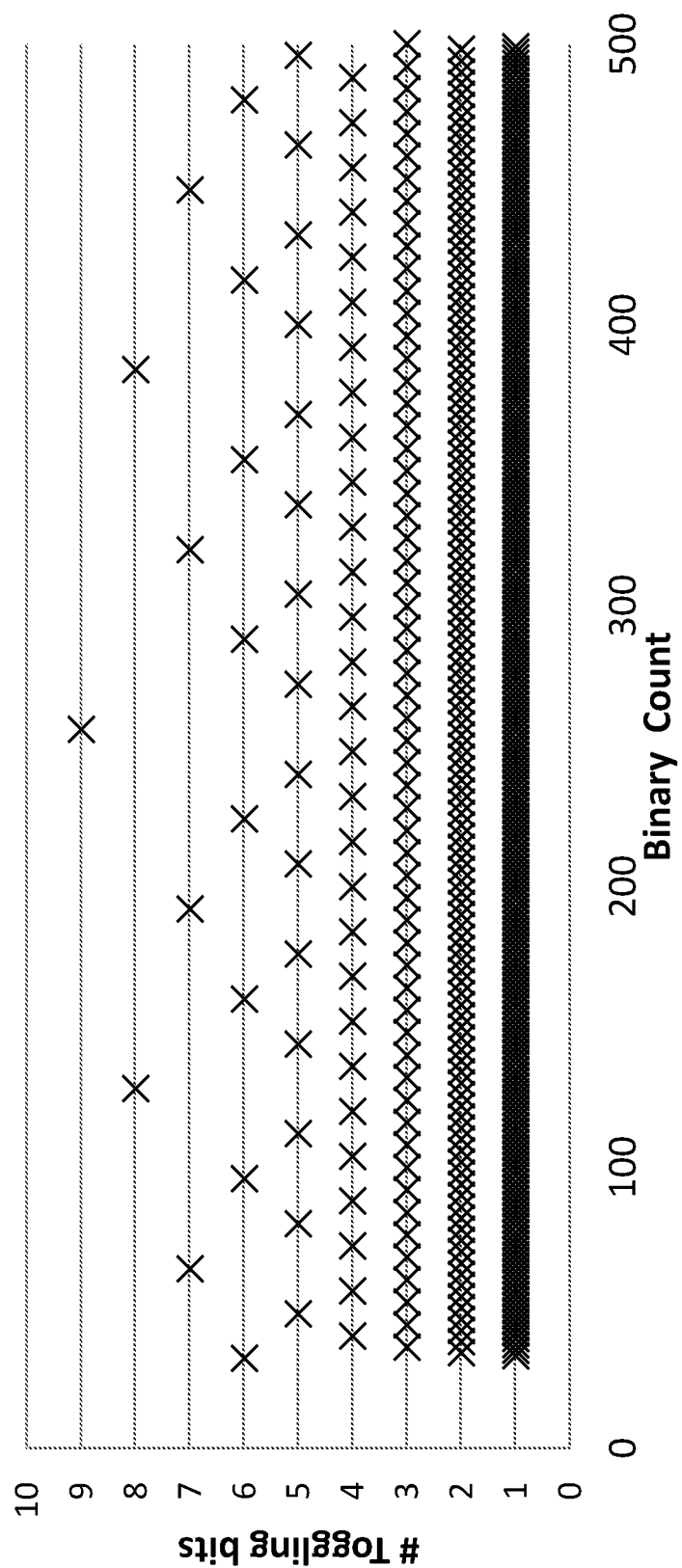
FIGS. 3A and 3B illustrate the variation in the average number of toggling bits as a function of the digital number for a pixel column group consisting of a single pixel column and 32 pixel columns, respectively.
Figure 3B:
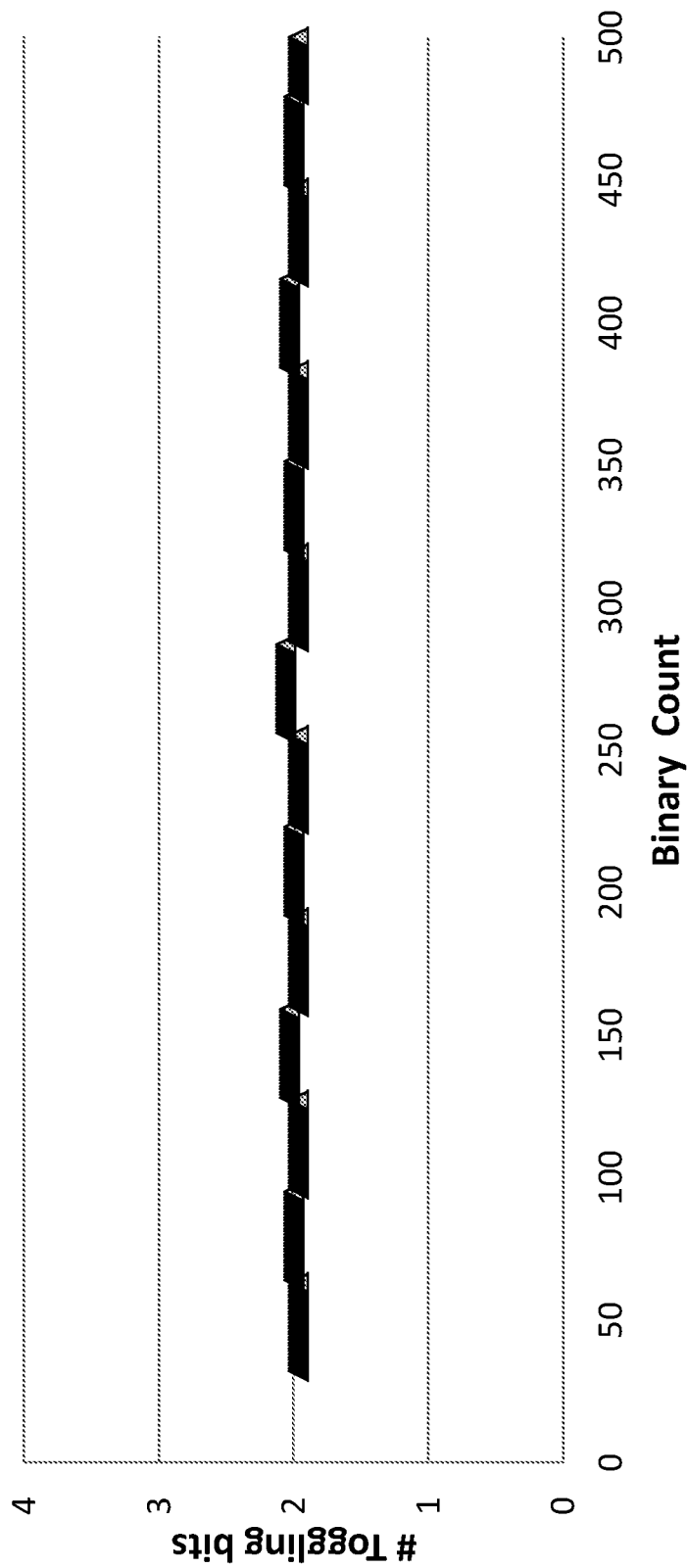

FIGS. 3A and 3B illustrate the variation in the average number of toggling bits, per pixel column, as a function of the binary count for a pixel column group consisting of a single pixel column and 32 pixel columns, respectively. As can be seen, when a pixel column group consists of 32 pixel columns, the variation in the number of toggling bits over the various count values is considerably less than when the pixel column group only consists of a single pixel column. However, increasing the number of the pixel columns comes at a cost as the number of digital numbers that is available for signal quantization is reduced by the amount of different initial values. Still, a significant reduction can already be obtained with relatively small pixel column groups, a strong reduction in the supply current variation can be achieved without substantially degrading the effective dynamical range of the binary counter.

As described above, a binary counter can, during a conversion process of pixel signals for a given row of pixels, be in a counting mode in which mode the binary counter increases its binary count value in dependence of the clock signal. The binary counter can also be in a non-counting mode, in which mode the binary counter has stopped counting. The mode in which the binary counter operates depends on the comparison between the ramp signal and the relevant pixel signal. For example, when the pixel signal in the form of a pixel voltage is smaller than the momentary ramp signal in the form of a ramp voltage, a count disable signal is outputted by the comparator. Similarly, when the pixel voltage is larger than the momentary ramp voltage, a count enable signal is outputted by the comparator. The count enable signal or count disable signal is fed to the binary counter, which will increase its binary count value when a positive edge is detected in the clock signal and the count enable signal is received.

Using pixel column groups addresses the variation in the number of toggling bits when the binary counters in that group are in the counting mode. However, whenever a binary counter switches between the counting mode to the non-counting mode a similar change in current drawn from the supply occurs. To address this problem, the present invention proposes a solution in which a dummy load is used to reduce the variation in current drawn from the supply caused by the transitions between the counting mode and the non-counting mode. This solution will be described next under reference to FIG. 4.

Figure 4:
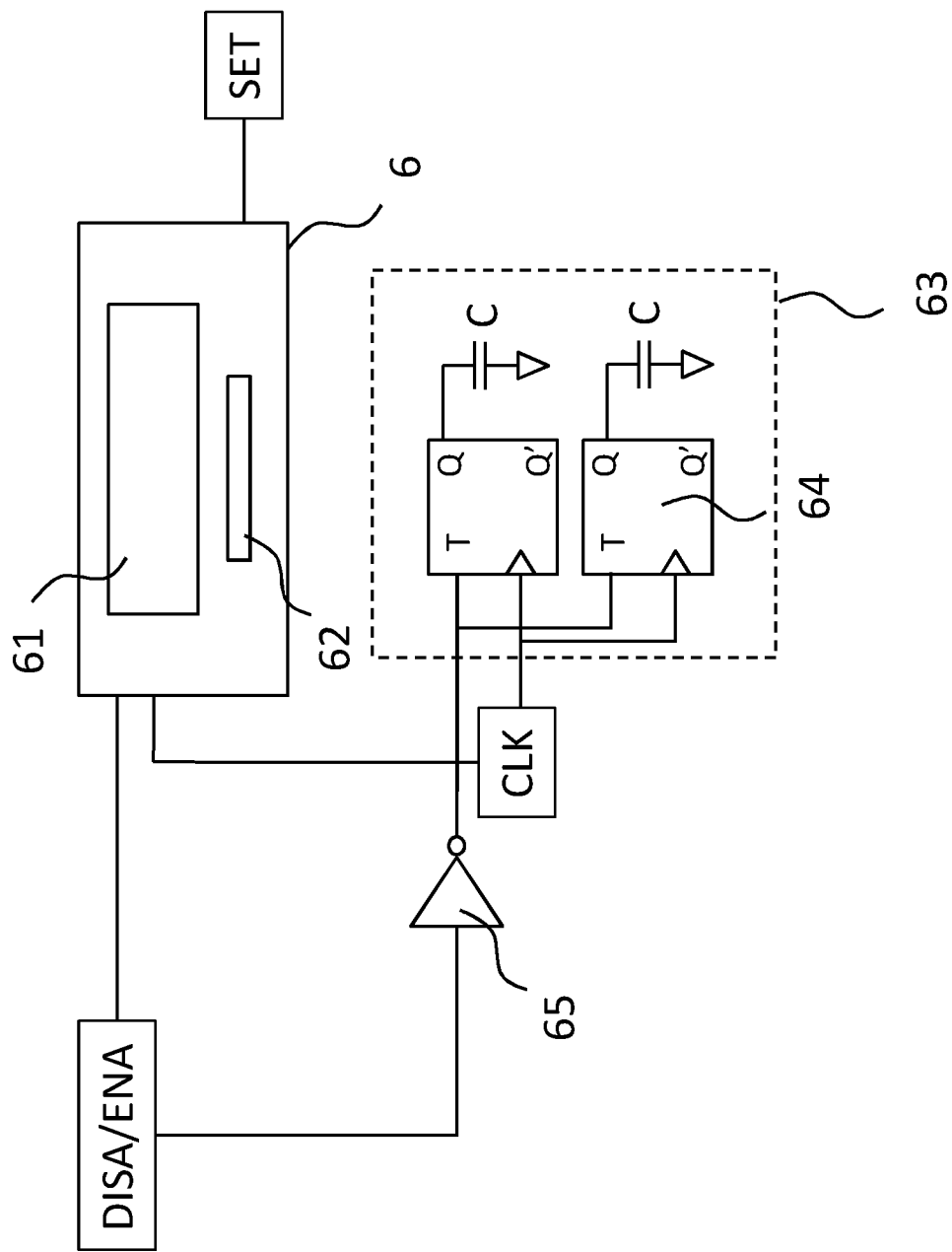
FIG. 4 illustrates an embodiment that addresses fluctuation in current drawn from the supply due to the transition between the counting mode and the non-counting mode.

FIG. 4 illustrates an embodiment of a binary ripple counter 6. This counter comprises a plurality 61 of cascaded flip-flops and an initial value unit 62 that holds the initial value to be used by this counter. Binary counter 6 has three inputs, i.e. a set input, a disable/enable signal input, and a clock input. Many different ways to implement binary counter 6 are known in the art.

If an instruction to set binary counter 6 is provided by controller 7 using a set signal (SET) provided to the set input of binary counter 6, the output of the plurality 61 of flip-flops will be set equal to the initial value using initial value unit 62.

Furthermore, binary counter 61 is configured to increase its binary count value if a rising edge is detected in the clock signal (CLK) provided at its clock input and if the disable/enable signal (DISA/ENA) received at the corresponding input indicates that the pixel signal is larger than the momentary ramp signal. When the DISA/ENA signal indicates that the pixel signal is smaller than the momentary ramp signal, the count value of the counter will not change.

The current drawn from the supply by counter 6 will reduce substantially when a disable count signal is received. This change may cause a fluctuation in the total amount of current drawn from the supply and may therefore result in interference as discussed above. To address this issue, a load 63 is connected in parallel to counter 6. This load comprises a number of flip-flops 64, preferably the same type of flip-flops as used in the plurality 61 of flip-flops in counter 6.

Load 63 is configured to toggle a predefined number of bits in response to the clock signal (CLK), provided that the output of comparator 5 is indicative for the situation wherein the momentary ramp signal is larger than the pixel signal and counter 6 is no longer counting. More in particular, load 63 is configured to perform said toggling when a triggering edge, typically the rising edge, is detected in the received clock signal (CLK).

Typically, current will be drawn by counter 6 mostly directly after receiving the triggering edge. Hence, by ensuring that load 63 will do the same, a large variation in current drawn from the supply can be prevented. For example, if the pixel signal becomes smaller than the momentary ramp signal in between adjacent rising edges of the clock signal (CLK), then counter 6 will be in the counting mode during the first rising edge and in the non-counting mode during the second rising edge. However, load 63 will be inactive during the first rising edge as the disable/enable signal, which has a logical high value when the pixel signal is larger than the momentary ramp signal, is inverted by inverter 65. Therefore, toggle flip-flops 64 will not toggle. On the other hand, during the second rising edge, a high logical value will be input into toggle flip-flops 64 and two bits will toggle.

The skilled person will readily understand that the present invention is not limited to logic being responsive to rising edges or to high logical values. Embodiments are equally possible in which a logical low value is used for causing the toggling of bits and/or in which the falling edge in the clock signal (CLK) is used for triggering.

The number of toggling bits, two in FIG. 4, should be chosen such that this number corresponds to the average number of toggling bits per counting step of counter 6. As may be appreciated from FIG. 3B, if pixel column groups are used having a sufficiently high number of pixel columns with different initial values, two bits will toggle on average. For that reason, two flip-flops 64 are used in the embodiment in FIG. 4. Still, in other embodiments wherein fewer pixel columns are present in a pixel column group, or even wherein no pixel column groups are used at all, a different number of flip-flops may be used.

Furthermore, instead of flip-flops other circuitry may be used. In general, load 63 comprises a toggling unit configured for toggling a predefined number of bits in response to the clock signal, wherein the predefined number corresponds to the average number of bits that toggle in the binary counter per counting step while being in the counting mode.

In binary ripple counter 6, the current drawn by a flip-flop that toggles also depends on the load that this flip-flop experiences at its output. To mimic this effect, flip-flops 64 may each be connected, at their non-inverting outputs, to respective capacitances C. Similarly, capacitances (not shown) may be connected to the input of flip-flops 64. The combination of the flip-flops 64 and the capacitances at the output, and optionally also at the input, should resemble the electrical switching behavior of the toggling flip-flops in the plurality 61 of flip-flops as much as possible to cause the same current to be drawn from the supply. Ideally, from the perspective of the supply, it should not or hardly be noticeable whether counter 6 is counting or not merely by looking at the overall current drawn from the supply.

Although in the embodiment above, load 63 has been described in conjunction with the use of pixel column groups, it should be noted that load 63 can be applied independently therefrom. More in particular, the use of pixel column groups reduces the variation over time in the number of toggling bits, and therefore of the variation over time of the current drawn from the supply, when the binary counters are counting. The use of load 63 reduces the variation in the current drawn from the supply due to binary counters making the transition from the counting mode to the non-counting mode. Although preferably used simultaneously, the pixel column groups and loads can be used independently from each other.

In the above, the present invention has been explained using detailed embodiments thereof. However, the present invention is not limited to these embodiments. Various modifications can be made to these embodiments without departing from the scope of the invention which is defined by the appended claims and their equivalents.

The invention claimed is:

1. An image sensor system, comprising:
a matrix having rows and columns of photo-sensitive pixels, wherein pixels that are arranged in the same column are configured to output an output signal onto a column bus for that column if such pixel is selected for read out;
a conversion unit for converting a pixel signal that is based on one or more output signals for a given pixel into a respective digital number, said conversion unit comprising a global ramp unit configured for generating a ramp signal, the conversion unit further comprising, for each column of pixels:
 a comparator for comparing the relevant pixel signal to the ramp signal;
 a binary counter configured for increasing a binary count value in dependence of a clock signal and a result of said comparing;
a controller for resetting each binary counter to an initial value at the start of a conversion cycle;
a binary count value collecting unit for collecting the binary count values from each binary counter;
characterized in that
the columns of pixels are grouped in a plurality of pixel column groups, each pixel column group comprising at least three columns of pixels, wherein the controller is configured to reset the binary counters corresponding to the pixel columns in a pixel column group at the start of a conversion cycle such that at least three pixel columns among the at least three pixel columns in a pixel column group are reset to a different initial value,
wherein the controller is configured to set, as initial value for an $m^{th}$ pixel column in a pixel column group, the $m^{th}$ lowest digital number to be outputted by the binary counter associated with that pixel column.

2. The image sensor according to claim 1, wherein the initial values and the number of pixel columns in a pixel column group are such that a variation over time in the number of bits toggling per counting step in a pixel column group is reduced compared to a variation over time in the number of bits toggling per counting step for a single pixel column.

3. The image sensor system according to claim 1, wherein the initial values to be used by each binary counter are predefined in hardware at the level of each binary counter, said controller being configured to trigger the binary counters to reset to the predefined initial value.

4. The image sensor system according to claim 1, wherein the binary count value collecting unit comprises a compensating unit that is configured for subtracting the initial value corresponding to a given binary counter from the binary count value outputted by that binary counter.

5. The image sensor system according to claim 1, wherein the different initial values correspond to a group of sequentially arranged binary numbers.

6. The image sensor system according to claim 1, wherein the controller is configured to simultaneously reset multiple or all binary counters.

7. The image sensor system according to claim 1, wherein said comparator is configured to output a count disable signal when the pixel signal is smaller than the momentary ramp signal and to output a count enable signal when the pixel signal is larger than the momentary ramp signal; wherein the binary counter comprises an enable input, a clock input, and an output, said binary counter being configured to increase said binary count value in dependence of the clock signal received at the clock input and the count enable signal being received at the enable input.

8. The image sensor system according to claim 1, wherein at least two, and preferably each, of the column groups are identical.

9. The image sensor system according to claim 1, wherein the binary count value collecting unit is configured for sequentially obtaining the binary count values from the pixel columns, and, for each read out binary count value corresponding to a given pixel column, to subtract the initial value associated with that given pixel column from the read out binary count value.

10. The image sensor system according to claim 9, wherein the binary count value collecting unit is configured to obtain a next binary count value in dependence of a clock signal, wherein the binary count value collecting unit further comprises:
a further binary counter that is configured to increase a count value outputted by the further binary counter in dependence of said clock signal;
a subtraction unit to subtract the count value from the binary count value that is obtained next.

11. The image sensor system according to claim 1, wherein the controller is further configured to, at the start of a conversion cycle, trigger the global ramp unit to start generating the ramp signal, the ramp signal preferably being a single slope ramp signal.

12. The image sensor system according to claim 1, wherein the binary counter is a binary ripple counter.

13. The image sensor system according to claim 1, further comprising a row selecting unit for selecting a single row of pixels among the rows of pixels.

14. The image sensor system according to claim 1,
wherein said image sensor system is an X-ray imaging system, and
wherein the matrix of pixels is covered by a scintillator layer for converting an incoming X-ray photon into visible light photon(s).

15. An image sensor system, comprising:
a matrix having rows and columns of photo-sensitive pixels, wherein pixels that are arranged in the same column are configured to output an output signal onto a column bus for that column if such pixel is selected for read out;
a conversion unit for converting a pixel signal that is based on one or more output signals for a given pixel into a respective digital number, said conversion unit comprising a global ramp unit configured for generating a ramp signal, the conversion unit further comprising, for each column of pixels:
 a comparator for comparing the relevant pixel signal to the ramp signal;
 a binary counter configured for increasing a binary count value in dependence of a clock signal and a result of said comparing;
a controller for resetting each binary counter to an initial value at the start of a conversion cycle;
a binary count value collecting unit for collecting the binary count values from each binary counter;
characterized in that
the columns of pixels are grouped in a plurality of pixel column groups, each pixel column group comprising at least three columns of pixels, wherein the controller is configured to reset the binary counters corresponding to the pixel columns in a pixel column group at the start of a conversion cycle such that at least three pixel columns among the at least three pixel columns in a pixel column group are reset to a different initial value, wherein the binary counter is an n-bit binary counter, wherein the initial values are values chosen from a group consisting of the $\alpha$ times $2^n$ lowest binary numbers that can be outputted by the binary counter, wherein $\alpha$ is a constant preferably smaller than 0.05.

* * * * *